US008389323B2

(12) United States Patent
Choi et al.

(10) Patent No.: US 8,389,323 B2
(45) Date of Patent: Mar. 5, 2013

(54) METHOD OF MANUFACTURING ORGANIC LIGHT EMITTING DISPLAY APPARATUS, SURFACE TREATMENT DEVICE FOR ORGANIC LIGHT EMITTING DISPLAY APPARATUS, AND ORGANIC LIGHT EMITTING DISPLAY APPARATUS

(75) Inventors: Eun-Sun Choi, Yongin (KR); Won-Yong Kim, Yongin (KR); Myeng-Woo Nam, Yongin (KR); Jin-Han Park, Yongin (KR); Sung-Gon Kim, Yongin (KR); Joon-Hyung Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 241 days.

(21) Appl. No.: 12/954,310

(22) Filed: Nov. 24, 2010

(65) Prior Publication Data

US 2011/0127507 A1 Jun. 2, 2011

(30) Foreign Application Priority Data

Nov. 27, 2009 (KR) .................. 10-2009-0115921

(51) Int. Cl.
*H01L 21/00* (2006.01)

(52) U.S. Cl. .................. 438/82; 257/E51.022

(58) Field of Classification Search .......... 438/82, 438/99; 257/40, 642, E25.009, E51.022
See application file for complete search history.

(56) References Cited

U.S. PATENT DOCUMENTS

| 8,067,887 | B2 * | 11/2011 | Sant et al. ..................... 313/504 |
| 2003/0143339 | A1 | 7/2003 | Kobayashi |
| 2003/0230967 | A1 | 12/2003 | Kawamura et al. |
| 2005/0139582 | A1 | 6/2005 | Tanaka |
| 2007/0071885 | A1 | 3/2007 | Kumagai |
| 2007/0148333 | A1 | 6/2007 | Morimoto |
| 2008/0182349 | A1 | 7/2008 | Yamazaki et al. |

FOREIGN PATENT DOCUMENTS

| JP | 2002-075640 A | 3/2002 |
| JP | 2003-323983 A | 11/2003 |
| JP | 2004-055159 A | 2/2004 |
| JP | 2004-095850 A | 3/2004 |

(Continued)

OTHER PUBLICATIONS

Official Action issued by the Korean Industrial Property Office dated Jul. 31, 2012 in corresponding Korean Patent Application No. 10-2009-0115921, 3 pages.

(Continued)

*Primary Examiner* — Quoc Hoang
(74) *Attorney, Agent, or Firm* — Knobbe Martens Olson & Bear LLP (57) ABSTRACT

Provided are a method of manufacturing an organic light emitting display apparatus, a surface treatment device for an organic light emitting display apparatus, and an organic light emitting display apparatus. To easily form organic emissive layers, the method includes: forming a first electrode on a substrate; forming on the first electrode a pixel defining layer having openings that expose predetermined portions of the first electrode; forming a charge carrying layer on the pixel defining layer and the first electrode exposed through the openings; hydrophobically treating portions of a surface of the charge carrying layer selectively, wherein the portions do not correspond to the openings, using a laser; forming organic emissive layers on the charge carrying layer; and forming a second electrode on the organic emissive layers so as to be electrically connected with the organic emissive layers.

15 Claims, 9 Drawing Sheets

FOREIGN PATENT DOCUMENTS

| | | |
|---|---|---|
| JP | 2005-331665 A | 12/2005 |
| JP | 2006-324171 | 11/2006 |
| JP | 2007-179798 A | 7/2007 |
| JP | 2008-53700 A | 3/2008 |
| JP | 2009-277601 A | 11/2009 |
| KR | 10-2005-067100 A | 6/2005 |
| KR | 10-2005-0067647 A | 7/2005 |
| KR | 10-2005-0080462 A | 8/2005 |
| KR | 10-2003-0055121 B1 | 3/2006 |
| KR | 10-2006-0126010 A | 12/2006 |
| KR | 10-2007-0036700 A | 4/2007 |
| KR | 100768230 B1 | 10/2007 |
| KR | 10-20080057412 A | 6/2008 |

OTHER PUBLICATIONS

Official Action issued by the Japanese Patent Office dated Feb. 7, 2012 regarding Japanese Patent Application No. 2010-263949, 3 pages.

Korean Office Action issued by the Korean Industrial Property Office dated Mar. 26, 2011 in Koran Patent Application No. 10-2009-0115921.

* cited by examiner

# METHOD OF MANUFACTURING ORGANIC LIGHT EMITTING DISPLAY APPARATUS, SURFACE TREATMENT DEVICE FOR ORGANIC LIGHT EMITTING DISPLAY APPARATUS, AND ORGANIC LIGHT EMITTING DISPLAY APPARATUS

CROSS-REFERENCE TO RELATED APPLICATIONS

This application claims the benefit of Korean Patent Application No. 10-2009-0115921, filed on Nov. 27, 2009, in the Korean Intellectual Property Office, the disclosure of which is incorporated herein in its entirety by reference.

BACKGROUND OF THE INVENTION

1. Field of the Invention

The present embodiments relate to a method of manufacturing an organic light emitting display apparatus, a surface treatment device for an organic light emitting display apparatus, an organic light emitting display apparatus, a method of manufacturing an organic light emitting display apparatus whereby an organic emissive layer may easily be formed, a surface treatment device for an organic light emitting display apparatus, and an organic light emitting display apparatus.

2. Description of the Related Art

Portable thin film type flat panel display devices have been widely used. Among flat panel display apparatuses, electroluminescent display apparatuses are self-emissive display apparatuses that have a wide viewing angle, high contrast, and a short response time. Thus, the electroluminescent display apparatuses have attracted attention as a next generation display apparatus. Also, organic light emitting display apparatuses include emissive layers formed of organic compounds, and have a good brightness and driving voltage and a short response time, and can form multi-color images, compared with inorganic light emitting display apparatuses.

An organic light emitting display apparatus includes a cathode, an anode, and an organic emissive layer. When a voltage is applied to the cathode and anode, the organic emissive layer emits visible rays, An organic light emitting display device includes sub-pixels for realizing red, green, and blue visible rays in order to realize a natural color screen. Organic emissive layers are formed in red sub-pixels to emit red visible rays, organic emissive layers are formed in green sub-pixels to emit green visible rays, and organic emissive layers are formed in blue sub-pixels to emit blue visible rays.

If the organic emissive layers are not formed in the desired corresponding sub-pixels, but in other sub-pixels, the organic emissive layers emit visible rays of mixed colors, thereby lowering image quality of an organic light emitting display apparatus.

When an organic emissive layer is formed using a nozzle printing method in which a solution is dropped downward using a nozzle, such a problem can occur, and thus it is difficult to improve the image quality of an organic light emitting display apparatus. The present embodiments overcome the above problems as well as provide additional advantages.

SUMMARY OF THE INVENTION

The present embodiments provide a method of manufacturing an organic light emitting display apparatus whereby an organic emissive layer may easily be formed, a surface treatment device for an organic light emitting display apparatus, and an organic light emitting display apparatus.

According to an aspect of the present embodiments, there is provided a method of manufacturing an organic light emitting display apparatus, the method including: forming a first electrode on a substrate; forming on the first electrode a pixel defining layer having openings that expose predetermined portions of the first electrode; forming a charge carrying layer on the pixel defining layer and the first electrode exposed through the openings; hydrophobically treating portions of a surface of the charge carrying layer selectively, wherein the portions do not correspond to the openings, using a laser; forming organic emissive layers on the charge carrying layer; and forming a second electrode so as to be electrically connected with the organic emissive layers.

The organic emissive layers may be formed on the charge carrying layer to correspond to the openings.

The charge carrying layer may be a hole transport layer or a hole injection layer.

The hydrophobically treating may be performed in an atmosphere of a fluoride compound gas.

The fluoride compound may include $CF_4$.

The hydrophobically treating may include irradiating a laser beam generated by an ultraviolet laser source onto the charge carrying layer, wherein the laser beam is integrated through a diffractive optical element (DOE) lens, a collimating lens, and a projection lens.

In the hydrophobically treating, a guide mirror may be used to guide the laser beam in a desired direction.

The hydrophobically treating may include irradiating a laser beam generated by an optical system having an ultraviolet laser source onto the charge carrying layer through a polygon mirror.

The hydrophobically treating may be performed in such a way that, while the laser beam is continuously generated by the optical system, the polygon mirror rotates The hydrophobically treating may be performed in such a way that the laser beam is scanned in the form of a strip from an end of the substrate to the other end of the substrate as the polygon mirror rotates.

The hydrophobically treating may include scanning the laser beam in the form of a strip from an end of the substrate to the other end of the substrate, and then moving the substrate or the optical system and polygon mirror in a direction perpendicular to the direction of the strip.

The substrate may be moved using a stage in a direction perpendicular to the direction of the strip.

The forming of the organic emissive layers may be performed using a nozzle printing method.

According to another aspect of the present embodiments, there is provided a surface treatment device for an organic light emitting display apparatus, being used in treating a surface of the organic light emitting display apparatus including a substrate, first electrodes formed on the substrate, a charge carrying layer formed on the first electrodes, organic emissive layers formed on the charge carrying layer, and a second electrode electrically connected to the organic emissive layers, the surface treatment device including: an optical system comprising an ultraviolet laser source; and a polygon mirror on which a laser beam generated by the optical system reaches.

While the laser beam is consecutively generated by the optical system in a fluoride gas atmosphere, the polygon mirror may rotate.

The laser beam may be scanned in the form of a strip from an end of the substrate to the other end of the substrate as the polygon mirror rotates.

The laser beam may be scanned in the form of a strip from an end of the substrate to the other end of the substrate, and then the substrate or the surface treatment device may be moved in a direction perpendicular to the direction of the strip.

The substrate may be moved using a stage in a direction perpendicular to the direction of the strip.

According to another aspect of the present embodiments, there is provided an organic light emitting display apparatus manufactured using the method described above.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF THE INVENTION

The present embodiments will now be described in more detail in terms of features and operations with reference to the accompanying drawings.

FIGS. 1A through 1G are cross-sectional views sequentially illustrating a method of manufacturing an organic light emitting display apparatus 100, according to an embodiment.

Figure 1A:
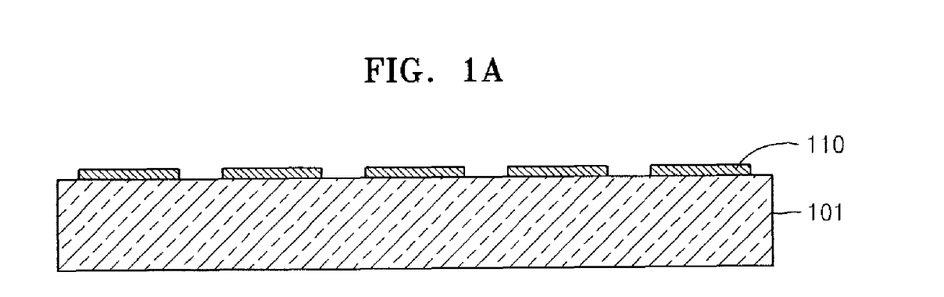
FIGS. 1A through 1G are cross-sectional views sequentially illustrating a method of manufacturing an organic light emitting display apparatus, according to an embodiment.

Referring to FIG. 1A, first electrodes 110 are formed on a substrate 101. Before the formation of the first electrodes 110, a thin-film transistor (TFT) may be formed on the substrate 101. The method of the present embodiment may be used in manufacturing an active matrix organic light emitting display apparatus and a passive matrix organic light emitting display apparatus.

The substrate 101 comprises, for example, a transparent glass material including $SiO_2$ as a main component. However, the substrate 101 is not limited thereto, and may comprise, for example, a transparent plastic material. A plastic substrate may comprise, for example, an insulating organic material, such as an insulating organic material selected from the group consisting of polyethersulphone (PES), polyacrylate (PAR), polyetherimide (PEI), polyethylene naphthalate (PEN), polyethyleneterephthalate (PET), polyphenylene sulfide (PPS), polyallylate, polyimide, polycarbonate (PC), cellulose triacetate (TAC), and cellulose acetate propionate (CAP).

The substrate 101 may also comprise, for example, a metal. The metal may include at least one of iron (Fe), chrome (Cr), manganese (Mn), nickel (Ni), titanium (Ti), molybdenum (Mo), stainless steel (SUS), an Invar alloy, an Inconel® alloy (Special Metals Corp., Huntington, W.V.), and a Kovar® alloy (Carpenter Technology Corp., Wyomissing, Pa.), but is not limited thereto. The substrate 101 may be in the form of foil.

To smooth a top surface of the substrate 101 and block impure elements from penetrating into the substrate 101, a buffer layer (not shown) may be formed on the substrate 101.

The first electrodes 110 are formed on the substrate 101. The first electrodes 110 may be formed in a predetermined pattern by photolithography. The pattern of the first electrodes 110 may be formed as strip lines, which are spaced apart from each other by a predetermined distance, in a passive matrix type organic light emitting display apparatus, and may be formed corresponding to sub-pixels in an active matrix type organic light emitting display apparatus.

The first electrodes 110 may be reflective electrodes or transmissive electrodes. When the first electrodes 110 are reflective electrodes, a reflective layer is first formed of Ag, Mg, Al, Pt, Pd, Au, Ni, Nd, Ir, Cr, Li, Ca, or compounds thereof, and ITO, IZO, ZnO, $In_2O_3$ or any compound having a high work function is then deposited on the reflective layer to form the first electrodes 110.

When the first electrodes 110 are transmissive electrodes, the first electrodes 110 may comprise, for example, ITO, IZO, ZnO, $In_2O_3$ or any compound having a high work function.

Figure 1B:
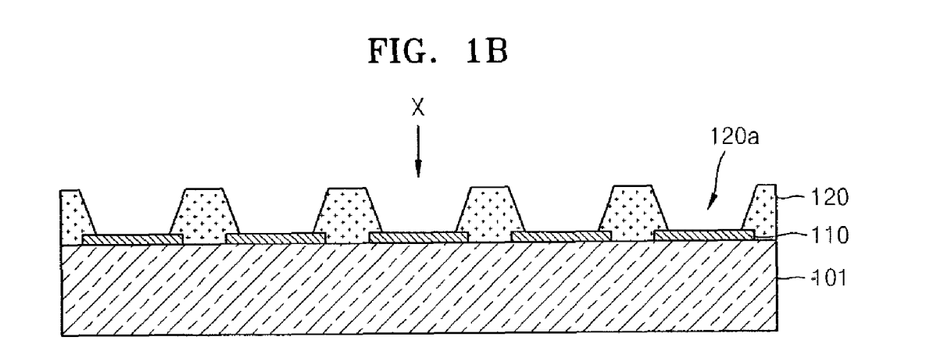

Referring to FIG. 1B, a pixel defining layer 120 is formed on the first electrodes 110. The pixel defining layer 120 includes openings 120a through which the first electrodes 110 are exposed. The pixel defining layer 120 comprises, for example, various insulating materials.

Figure 1C:
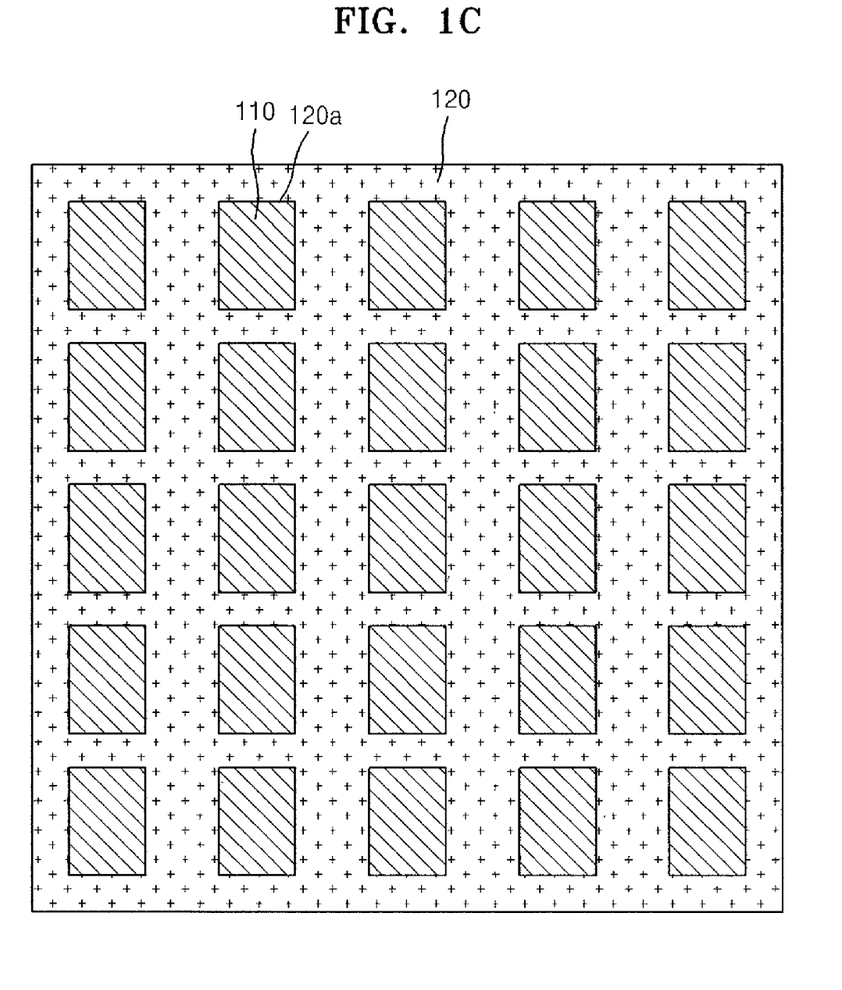

FIG. 1C is a top view seen from direction X of FIG. 1B. The openings 120a can be in a rectangular shape, but are not limited thereto. For example, the openings 120a may have a polygonal or curved shape according to the shape of sub-pixels.

Figure 1D:
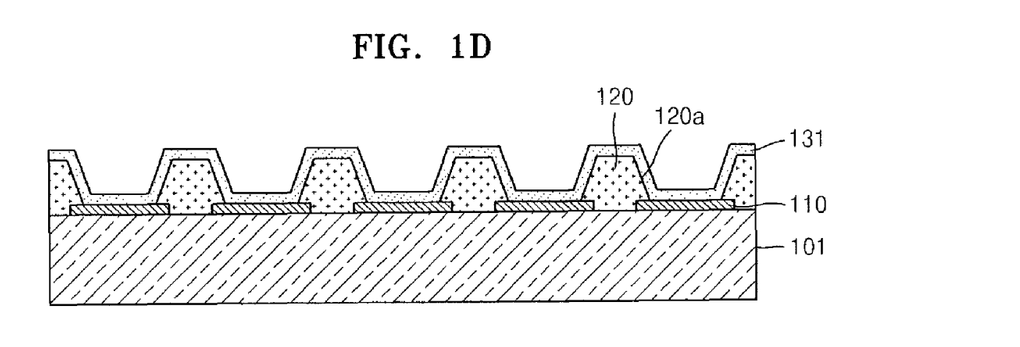

Referring to FIG. 1D, a charge carrying layer 131 is formed on an entire surface of the pixel defining layer 120 and the first electrodes 110 exposed through the openings 120a. The charge carrying layer 131 is formed without a separate patterning process.

The charge carrying layer 131 may include at least one of a hole transport layer and a hole injection layer. When the charge carrying layer 131 includes both the hole transport layer and the hole injection layer, the hole injection layer is formed closer to the first electrodes 110 than the hole transport layer.

Figure 1E:
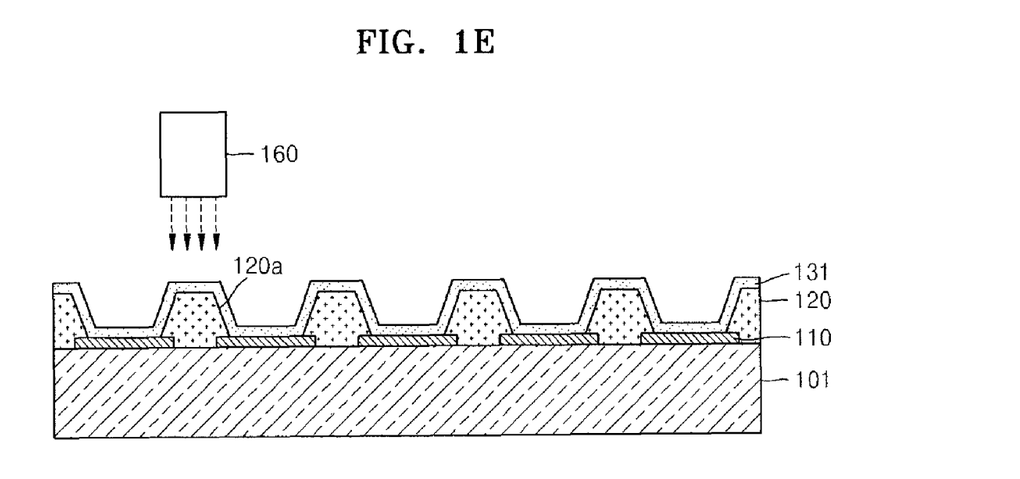

Referring to FIG. 1E, a surface of the charge carrying layer 131 is hydrophobically treated using a laser irradiation device 160. Portions of the surface of the charge carrying layer 131, which do not correspond to the openings 120a, are selectively hydrophobically treated. Portions of the surface of the charge carrying layer 131, which are not portions corresponding to bottom surfaces and inner surfaces of the openings 120a, are hydrophobically treated.

The laser irradiation device 160 can be, for example, an ultraviolet laser irradiation device, and irradiates converged laser beams on the portions of the surface of the charge carrying layer 131, which do not correspond to the openings 120a.

The hydrophobic treatment involves using a reaction gas, and a fluoride compound may be used in the hydrophobic treatment as the reaction gas. The reaction gas may be $CF_4$, for example. When the laser irradiation device 160 generates laser beams in a $CF_4$ atmosphere, the $CF_4$ is decomposed to generate fluoride ions, and the fluoride ions adsorb to the surface of the charge carrying layer 131. The generated fluoride ions combine with the surface of the charge carrying layer 131 onto which the laser beams are irradiated, and thus the surface of the charge carrying layer 131 has low surface energy and is a hydrophobic surface.

As described above, desired portions of the surface of the charge carrying layer 131 are hydrophobically treated using the laser irradiation device 160, without using a separate mask.

Figure 1F:
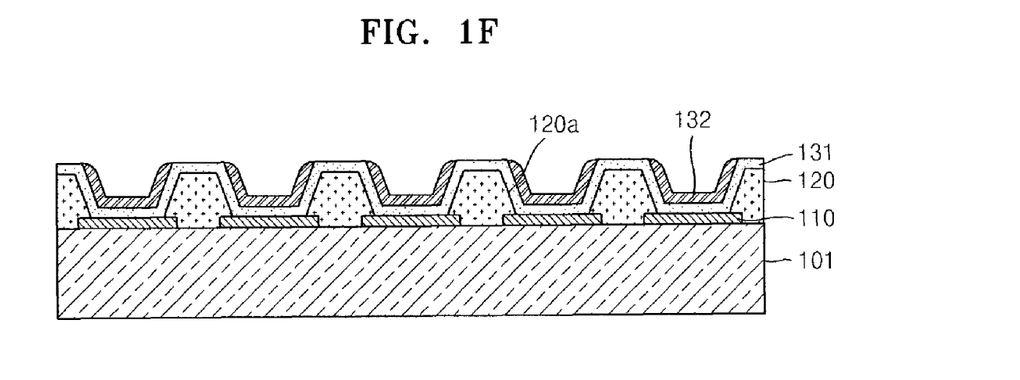

Referring to FIG. 1F, organic emissive layers 132 are formed on the charge carrying layer 131. The organic emissive layers 132 may be formed using a nozzle printing method. The organic emissive layers 132 may include organic emissive layers which emit red, green and blue visible rays.

As described above, the remaining portions of the surface of the charge carrying layer 131 which do not correspond to the bottom surfaces and inner surfaces of the openings 120a are hydrophobically treated, and thus the organic emissive layers 132 are formed to respectively correspond to the openings 120a. The organic emissive layers 132 are easily formed to respectively correspond to the openings 120, are not formed on portions of the surface of the charge carrying layer 131, which correspond to the top surface of the pixel defining layer 120, and are not formed outside the openings 120a.

The organic emissive layers 132 are easily formed in a desired pattern, thereby improving image quality of the organic light emitting display apparatus.

The organic emissive layers 132 are formed of various materials. For example, the organic emissive layers 132 which emit red visible rays may comprise, for example, tetraphenylnaphthacene (rubrene), tris(1-phenylisoquinoline)iridium(III) (Ir(piq)$_3$), bis(2-benzo[b]thiophene-2-yl-pyridine)(acetylacetonate)iridium (III) (Ir(btp)$_2$(acac)), tris(dibenzoylmethane)phenanthroline europium (III) (Eu(dbm)$_3$(phen)), tris[4,4'-di-tert-butyl-(2,2')-bipyridine]ruthenium (III) complex (Ru(dtb-bpy)$_3$*2(PF$_6$)), DCM1, DCM2, Eu(thenoyltrifluoroacetone)$_3$ (Eu(TTA)$_3$), butyl-6-(1,1,7,7-tetramethyl julolidyl-9-enyl)-4H-pyran (DCJTB), or a polymer organic light emitting material such as polyfluorene-based polymer or polyvinyl-based polymer.

The organic emissive layers 132 which emit green visible rays may comprise, for example, a green light emitting material such as 3-(2-benzothiazolyl)-7-(diethylamino)coumarin (Coumarin 6), 2,3,6,7-tetrahydro-1,1,7,7,-tetramethyl-1H,5H,11H-10-(2-benzothiazolyl)quinolizin-[9,9a,1gh]coumarin (C545T), N,N'-dimethyl-quinacridone (DMQA), tris(2-phenylpyridine)iridium (III) (Ir(ppy)$_3$), or a polymer light emitting material such as polyfluorene-based polymer or polyvinyl-based polymer.

The organic emissive layers 132 which emit blue visible rays may comprise, for example, a blue light emitting material such as oxadiazole dimer dyes (Bis-DAPDXP), spiro compounds (Spiro-DPVBi, Spiro-6P), triarylamine compounds, bis(styryl)amine (DPVBi, DSA), 4,4'-bis(9-ethyl-3-carbazovinylene)-1,1'-biphenyl (BCzVBi), perylene, 2,5,8,11-tetra-tert-butylperylene (TPBe), 9H-carbazol-3,3'-(1,4-perylene-di-2,1-ethene-diyl)bis[9-ethyl-(9C) (BCzVB), 4,4-bis[4-(di-p-tolylamino)styryl]biphenyl (DPAVBi), 4-(di-p-tolylamino)-4'-[(di-p-tolylamino)styryl]stilbene (DPAVB), 4,4'-bis[4-(diphenylamino)styryl]biphenyl (BDAVBi), bis(3,5-difluoro-2-(2-pyridyl)phenyl-(2-carboxypyridyl)iridium III (FIrPic), or a polymer light emitting material such as polyfluorene-based polymer or polyvinyl-based polymer.

Figure 1G:
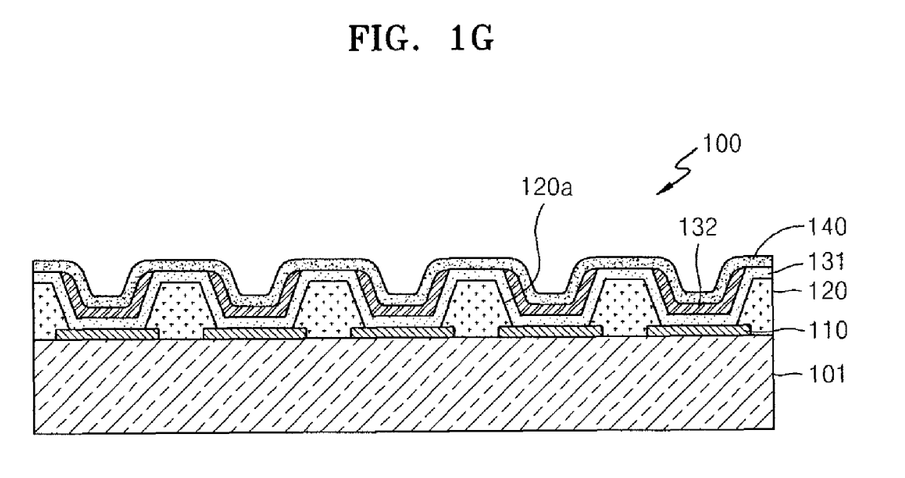

Referring to FIG. 1G, a second electrode 140 is formed on the organic emissive layers 132, thereby completing the manufacture of the organic light emitting display apparatus 100.

Although not illustrated in FIG. 1G, an electron transport layer or an electron injection layer may be further formed between the organic emissive layers 132 and the second electrode 140.

The second electrode 140 may be formed in a predetermined pattern, and the pattern of the second electrode 140 may be in the form of strips that are perpendicular to the pattern of the first electrode 110, in a passive matrix type organic light emitting display apparatus, and may be formed throughout an entire active region which realizes images, in an active matrix type organic light emitting display apparatus.

The second electrode 140 may be a transmissive electrode or a reflective electrode. When the second electrode 140 is a transmissive electrode, a metal having a low work function, such as Ag, Mg, Al, Pt, Pd, Au, Ni, Nd, Ir, Cr, Li, Ca, or compounds thereof is deposited, and an auxiliary electrode layer or a bus electrode line comprises, for example, a transparent conductive material, such as ITO, IZO, ZnO, or In$_2$O$_3$, on the metal in order to form the second electrode 140.

When the second electrode 140 is a reflective electrode, the second electrode 140 may comprise, for example, a metal having a low work function, such as Ag, Mg, Al, Pt, Pd, Au, Ni, Nd, Ir, Cr, Li, or Ca. In the present embodiment, the first electrodes 110 are anodes, and the second electrode 140 is a cathode, but the opposite case is possible.

Although not illustrated in FIG. 1G, a sealing element (not shown) may be disposed to face a surface of the substrate 101. The sealing element is formed to protect the organic emissive layers 132 from external moisture or oxygen, and comprises, for example, a transparent material. The sealing element may comprise, for example, glass, plastic, or a stacked structure of a plurality of organic materials and inorganic materials.

According to the method of the present embodiment, the charge carrying layer 131 is formed on the entire surface of the pixel defining layer 120, and then portions of the surface of the charge carrying layer 131, which are the portions on which the organic emissive layers 132 are not formed, are hydrophobically treated. The portions of the surface of the charge carrying layer 131, which do not correspond to the openings 120a, are hydrophobically treated.

Thus, the organic emissive layers 132 are easily formed in desired regions. The organic emissive layers 132 are formed only in the corresponding sub-pixels of which organic emitting materials do not mix with organic emitting materials in adjacent sub-pixels. Accordingly, the image quality of the organic light emitting display apparatus 100 is enhanced.

Portions of the surface of the charge carrying layer 131, which directly contact the organic emissive layers 132, are treated, and thus the organic emissive layers 132 are easily formed therein. In addition, in the surface treatment process, damage to the first electrode 110 may be prevented. As a result, the organic light emitting display apparatus may have enhanced image quality.

FIGS. 2A through 2D are cross-sectional views sequentially illustrating a method of manufacturing an organic light emitting display apparatus 200, according to another embodiment. For convenience of explanation, the differences between the present embodiment and the previous embodiment will be mainly described.

Figure 2A:
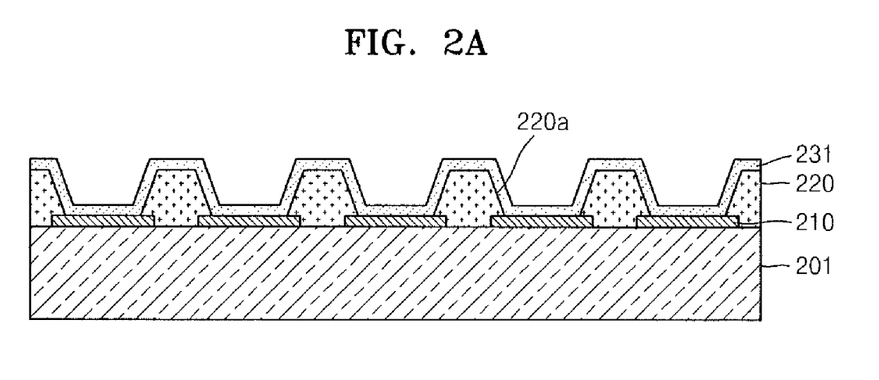
FIGS. 2A through 2D are cross-sectional views sequentially illustrating a method of manufacturing an organic light emitting display apparatus, according to another embodiment.

Referring to FIG. 2A, first electrodes 210, a pixel defining layer 220, and a charge carrying layer 231 are sequentially formed on a substrate 201.

The first electrodes 210 are formed on the substrate 201, and the pixel defining layer 220 is formed on the first electrodes 210. The pixel defining layer 220 includes openings 220a through which the first electrodes 210 are exposed.

Then, the charge carrying layer 231 is formed on an entire surface of the pixel defining layer 220 and the first electrodes 210 exposed through the openings 220a. The charge carrying layer 231 is formed without a separate patterning process.

The charge carrying layer 231 may include at least one of the hole transport layer and the hole injection layer.

The features and materials of the substrate 201, the first electrode 210, the pixel defining layer 220, and the charge carrying layer 231 have already been described in the previous embodiment, and thus a detailed description thereof is not provided herein.

Figure 2B:
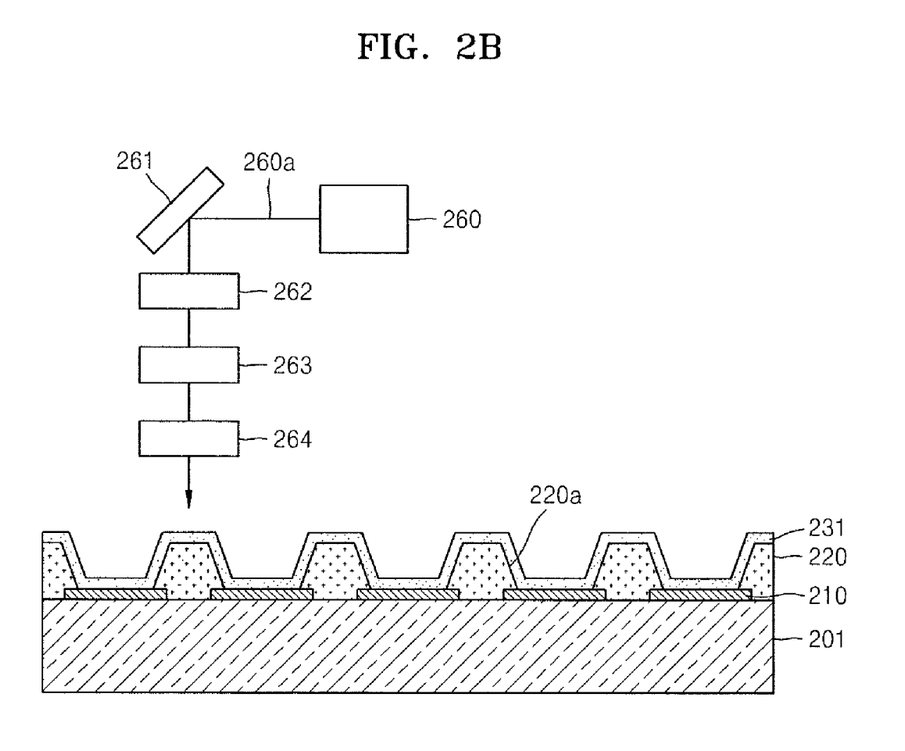

Referring to FIG. 2B, the surface of the charge carrying layer 231 is hydrophobically treated. In this regard, portions of the surface of the charge carrying layer 231, which do not correspond to the openings 220a, are hydrophobically treated selectively. The remaining portions of the surface of the charge carrying layer 231 except the portions corresponding to bottom surfaces and inner surfaces of the openings 220a are hydrophobically treated.

The hydrophobic treatment is performed using a laser beam 260a emitted from an ultraviolet laser source 260. The laser beam 260a can be modified so as to be irradiated in desired regions, for example, the remaining portions of the surface of the charge carrying layer 231 except for the portions corresponding to the bottom surfaces and the inner surfaces of the openings 220a. For this, the laser beam 260a proceeding in one direction is guided in a desired direction by a guide mirror 261, and the guided laser beam 260a transmits through a diffractive optical element (DOE) lens 262 to be in the form of a flat beam. Then, the laser beam 260a transmits through a collimating lens 263 to have a uniform energy, and transmits through a projection lens 264 to output as a beam having a desired magnification. Thus, the laser beam 260a is irradiated onto the surface of the charge carrying layer 231.

The hydrophobic treatment involves using a reaction gas, and a fluoride compound may be used in the hydrophobic treatment as the reaction gas. For example, the reaction gas may be $CF_4$. The reaction gas such as $CF_4$ is decomposed by an ultraviolet laser beam to generate fluoride ions, and the fluoride ions adsorb to the surface of the charge carrying layer 231. The generated fluoride ions combine with the surface of the charge carrying layer 231 onto which the laser beam is irradiated, and thus the surface of the charge carrying layer 231 has low surface energy and is a hydrophobic surface.

In the present embodiment, without using a separate mask, desired portions of the surface of the charge carrying layer 231 are hydrophobically treated by controlling a light beam generated by the ultraviolet laser source 260.

Figure 2C:
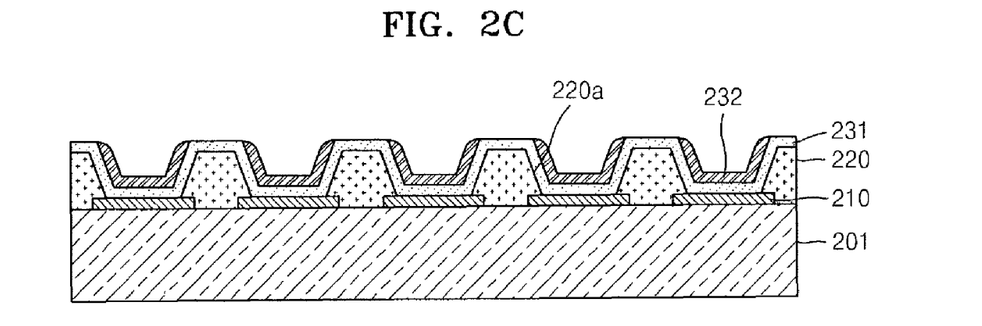

Referring to FIG. 2C, organic emissive layers 232 are formed on the charge carrying layer 231. The organic emissive layers 232 may be formed using a nozzle printing method.

As described above, the remaining portions of the surface of the charge carrying layer 231 except for the portions corresponding to the bottom surfaces and inner surfaces of the openings 220a are hydrophobically treated, and thus the organic emissive layers 232 are formed to respectively correspond to the openings 220a. The organic emissive layers 232 are easily formed to respectively correspond to the openings 220a, are not formed on portions of the surface of the charge carrying layer 231, which correspond to the top surface of the pixel defining layer 120 and are not formed outside the openings 220a.

Accordingly, the organic emissive layers 232 are easily formed in a desired pattern, thereby improving image quality of the organic light emitting display apparatus 200.

Figure 2D:
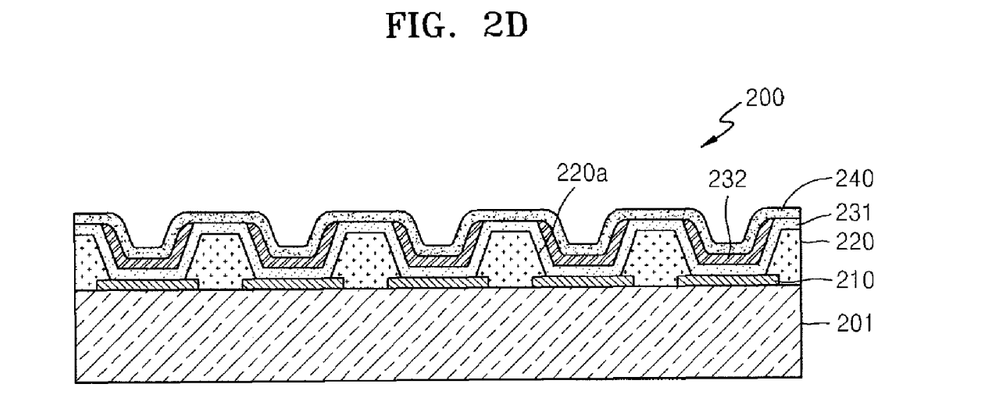

Referring to FIG. 2D, a second electrode 240 is formed on the organic emissive layers 232, thereby completing the manufacture of the organic light emitting display apparatus 200.

Although not illustrated in FIG. 2D, an electron transport layer or an electron injection layer may be further formed between the organic emissive layers 232 and the second electrode 240.

Although not illustrated in FIG. 2D, a sealing element (not shown) may be disposed to face a surface of the substrate 201. The sealing element is formed to protect the organic emissive layers 232 from external moisture or oxygen, and comprises, for example, a transparent material. The sealing element may comprise, for example, glass, plastic, or a stacked structure of a plurality of organic materials and inorganic materials.

FIGS. 3A through 3E are cross-sectional views sequentially illustrating a method of manufacturing an organic light emitting display apparatus, according to another embodiment. For convenience of explanation, the differences between the present embodiment and the previous embodiment will be mainly described.

Figure 3A:
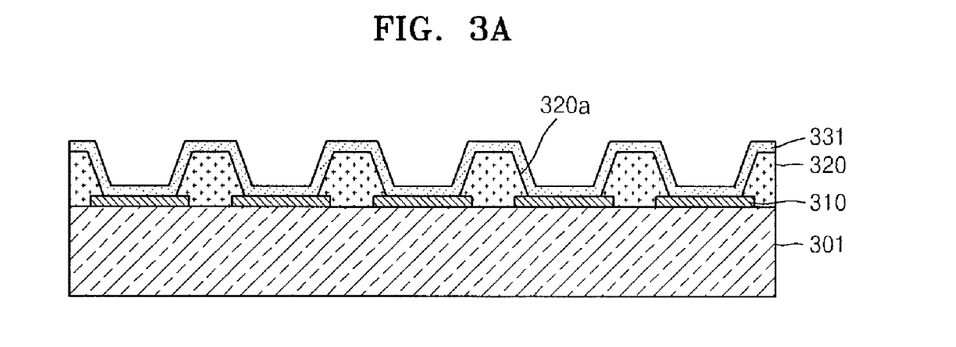
FIGS. 3A through 3E are cross-sectional views sequentially illustrating a method of manufacturing an organic light emitting display apparatus, according to another embodiment.

Referring to FIG. 3A, first electrodes 310, a pixel defining layer 320, and a charge carrying layer 331 are sequentially formed on a substrate 301.

The first electrodes 310 are formed on the substrate 301, and the pixel defining layer 320 is formed on the first electrodes 310. The pixel defining layer 320 includes openings 320a through which the first electrodes 310 are exposed.

The charge carrying layer 331 is formed on an entire surface of the pixel defining layer 320 and the first electrodes 310 exposed through the openings 320a. The charge carrying layer 331 is formed without a separate patterning process.

The charge carrying layer 331 may include at least one of the hole transport layer and the hole injection layer.

The features and materials of the substrate 301, the first electrode 310, the pixel defining layer 320, and the charge carrying layer 331 have already been described in the previous embodiment, and thus a detailed description thereof is not provided herein.

Figure 3B:
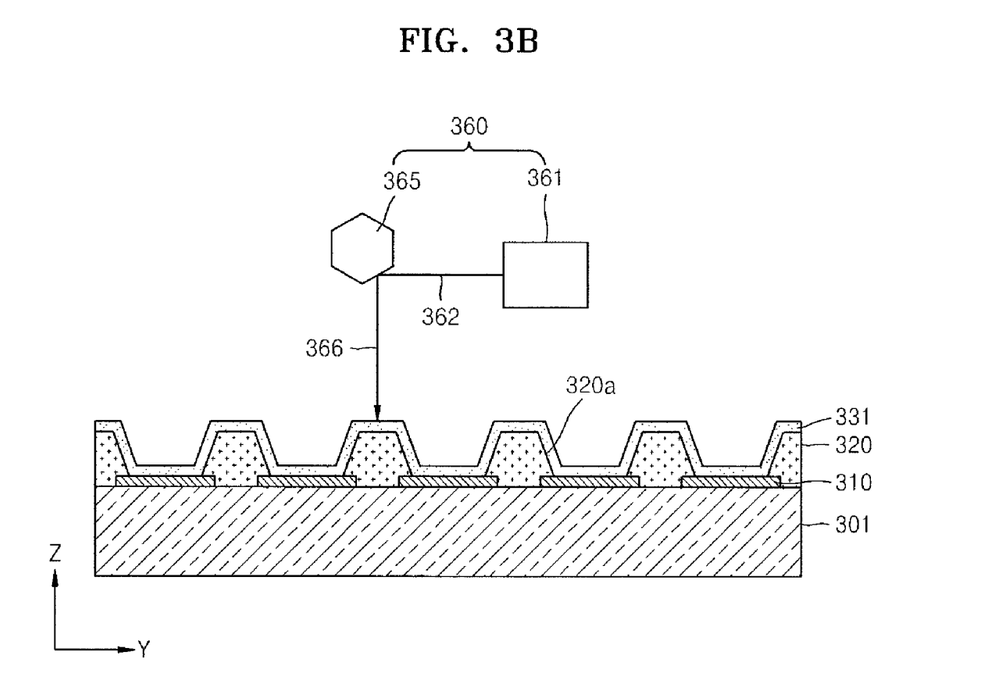
Figure 3C:
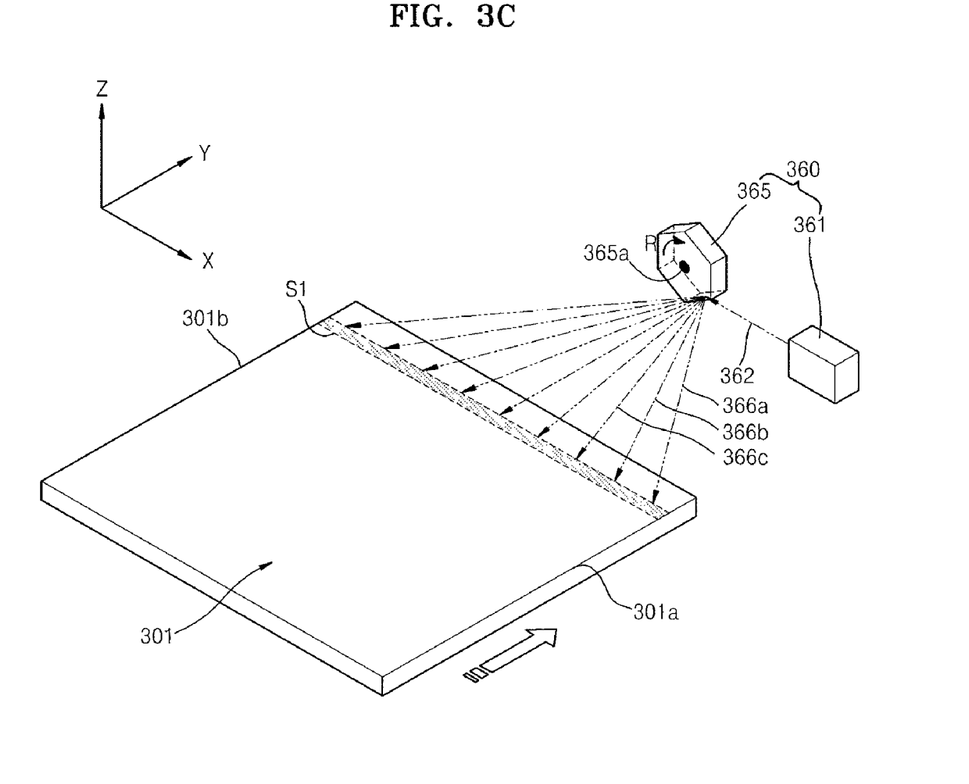

Referring to FIGS. 3B and 3C, a surface of the charge carrying layer 331 is hydrophobically treated. FIG. 3C is a schematic perspective view of FIG. 3B. For convenience of explanation, only the substrate 301 is illustrated in FIG. 3C.

After the charge carrying layer 331 is formed, portions of the surface of the charge carrying layer 331, which do not correspond to the openings 320a, are hydrophobically treated selectively. The remaining portions of the surface of the charge carrying layer 331 except for portions corresponding to bottom surfaces and inner surfaces of the openings 320a are hydrophobically treated.

The hydrophobic treatment is performed using a surface treatment device 360. The surface treatment device 360 includes an optical system 361 including an ultraviolet laser source, and a polygon mirror 365.

The optical system 361 includes the ultraviolet laser source for generating an ultraviolet laser beam. The ultraviolet laser source generates a laser beam 362, which is modified so as to be irradiated on the remaining portions of the surface of the charge carrying layer 331 except for the portions corresponding to the bottom surfaces and inner surfaces of the openings 320a in a desired form and in a desired energy size.

The laser beam 362 is incident on the polygon mirror 365, and reflected by the polygon mirror 365 to become laser beams 366a, 366b, 366c, etc. The laser beams 366a, 366b, 366c, etc. are irradiated onto the surface of the charge carrying layer 331.

The polygon mirror 365 includes an axis 365a, and rotates around the axis 365a in an arrow direction indicated by R. While the polygon mirror 365 continually rotates, the laser beam 362 is continually irradiated onto the polygon mirror 365, and reflected by the polygon mirror 365, and thus the laser beam 366 is continually irradiated onto the surface of the charge carrying layer 331.

By the rotating polygon mirror 365, a laser beam 366a reflected first by the polygon mirror 365 is irradiated in a direction of the substrate 301, a laser beam 366b is irradiated in a direction of the substrate 301, and a laser beam 366c is then irradiated in a direction of the substrate 301. In such manner, the laser beam 366 is irradiated in the form of a strip S1 ranging from an end 301a of the substrate 301 to the other end 301b of the substrate 301. The laser beam 366a, the laser beam 366b, and the laser beam 366c are described for the purpose of convenience of explanation only, but the present embodiments are not limited thereto. The laser beam 366 may be scanned in the form of the strip S1 by variously adjusting a generation duration time of the laser beam 362 generated by the optical system 361 and a rotating speed of the polygon mirror 365.

After the laser beam is scanned in the form of the strip S1, the substrate 301 or the surface treatment device 360 is moved in a direction perpendicular to the direction of strip S1, and the hydrophobic treatment is then performed continuously. For example, the substrate 301 may be moved in a Y direction. For this, the substrate 301 is mounted on a stage (not shown), and the stage may be moved in a Y direction.

The hydrophobic treatment involves using a reaction gas, and a fluoride compound may be used in the hydrophobic treatment as the reaction gas. The reaction gas may be $CF_4$. The reaction gas such as $CF_4$ is decomposed to generate fluoride ions, and the fluoride ions adsorb to the surface of the charge carrying layer 331. The generated fluoride ions combine with the surface of the charge carrying layer 131 onto which the laser beams are irradiated, and thus the surface of the charge carrying layer 131 has low surface energy and is a hydrophobic surface.

In the present embodiment, desired portions of the surface of the charge carrying layer 331 are hydrophobically treated using the surface treatment device 360, without using a separate mask. In addition, the hydrophobic treatment is consecutively performed from the side 301a of the substrate 301 to the other side 301b of the substrate 301, the substrate 301 or the surface treatment device 360 is then sequentially moved, thereby improving the efficiency of the hydrophobic treatment process.

Figure 3D:
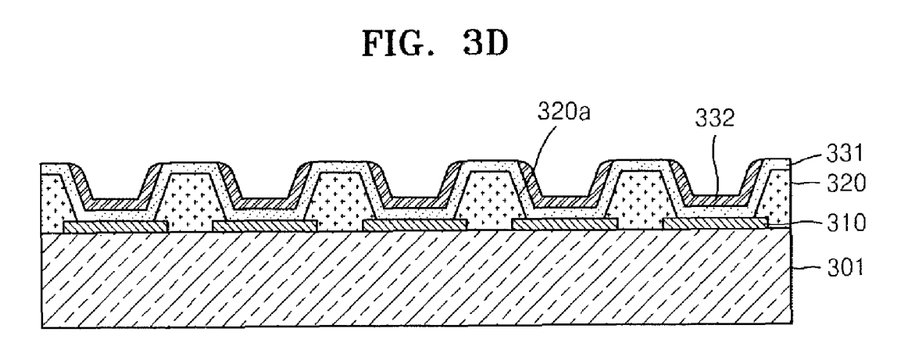

Referring to FIG. 3D, organic emissive layers 332 are formed on the charge carrying layer 331. The organic emissive layers 332 may be formed using a nozzle printing method.

As described above, the remaining portions of the surface of the charge carrying layer 331 except for the portions corresponding to the bottom surfaces and inner surfaces of the openings 320a are hydrophobically treated, and thus the organic emissive layers 332 are stably formed to respectively correspond to the openings 320a. The organic emissive layers 332 are easily formed to respectively correspond to the openings 320a, are not formed on portions of the surface of the charge carrying layer 331, which correspond to the top surface of the pixel defining layer 320, and are not formed outside the openings 320a.

Accordingly, the organic emissive layers 332 are easily formed in a desired pattern, thereby improving image quality of the organic light emitting display apparatus 300.

Figure 3E:
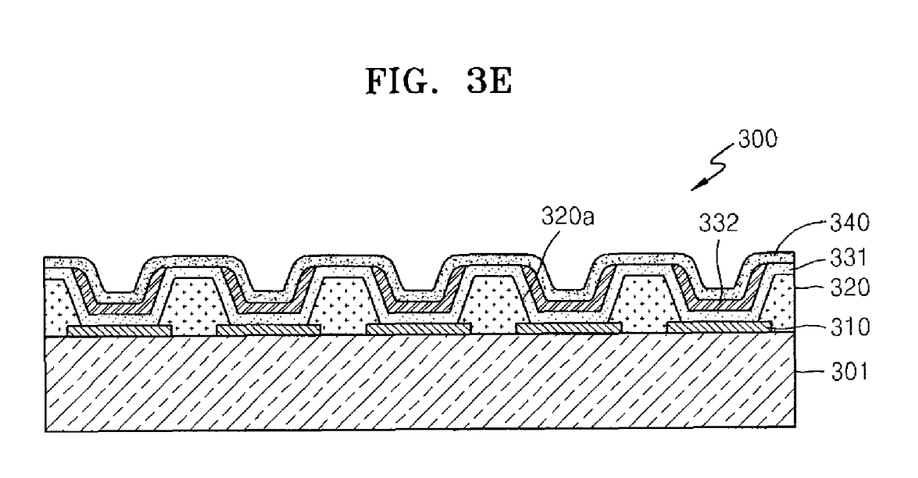

Referring to FIG. 3E, a second electrode 340 is formed on the organic emissive layers 332, thereby completing the manufacture of the organic light emitting display apparatus 300.

Although not illustrated in FIG. 3E, an electron transport layer or an electron injection layer may be further formed between the organic emissive layers 332 and the second electrode 340.

Although not illustrated in FIG. 3E, a sealing element (not shown) may be disposed to face a surface of the substrate 301. The sealing element is formed to protect the organic emissive layers 332 from external moisture or oxygen, and comprises, for example, a transparent material. The sealing element may comprise, for example, glass, plastic, or a stacked structure of a plurality of organic materials and inorganic materials.

According to the present embodiments, there are provided a method of manufacturing an organic light emitting display apparatus, a surface treatment device for an organic light emitting display apparatus, and an organic light emitting display apparatus. In the method, organic emissive layers are formed to respectively correspond to sub-pixels of which organic emitting materials do not mix with organic emitting materials in adjacent sub-pixels, thereby improving image quality of an organic light emitting display apparatus.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A method of manufacturing an organic light emitting display apparatus, the method comprising:
    forming a first electrode on a substrate;
    forming on the first electrode a pixel defining layer having first openings that expose predetermined portions of the first electrode;
    forming a charge carrying layer on the pixel defining layer and the first electrode exposed through the first openings;
    hydrophobically treating first portions of the surface of the charge carrying layer selectively with a laser and a reaction gas, wherein the first portions do not correspond to the openings;
    forming organic emissive layers on the charge carrying layer, and
    forming a second electrode so as to be electrically connected with the organic emissive layers.

2. The method of claim 1, wherein the organic emissive layers are formed on the charge carrying layer to correspond to the first openings.

3. The method of claim 1, wherein the charge carrying layer comprises at least one of a hole transport layer and a hole injection layer.

4. The method of claim 1, wherein the reaction gas is a fluoride compound gas.

5. The method of claim 4, wherein the fluoride compound gas comprises $CF_4$.

6. The method of claim 1, wherein the step of hydrophobically treating first portions of the surface of the charge carrying layer comprises irradiating a laser beam generated by an ultraviolet laser source onto the charge carrying layer, wherein the laser beam is integrated through a diffractive optical element (DOE) lens, a collimating lens, and a projection lens.

7. The method of claim 6, wherein, in the step of hydrophobically treating first portions of the surface of the charge carrying layer, a guide mirror is used to guide the laser beam in a desired direction.

8. The method of claim 1, wherein the step of hydrophobically treating first portions of the surface of the charge carrying layer comprises irradiating a laser beam generated by an optical system having an ultraviolet laser source onto the charge carrying layer through a polygon mirror.

9. The method of claim 8, wherein the step of hydrophobically treating first portions of the surface of the charge carrying layer is performed in such a way that the polygon mirror rotates while the laser beam is continuously generated by the optical system.

10. The method of claim 8, wherein the step of hydrophobically treating first portions of the surface of the charge carrying layer is performed in such a way that the laser beam is scanned in the form of a strip from an end of the substrate to the other end of the substrate as the polygon mirror rotates.

11. The method of claim 8, wherein the step of hydrophobically treating first portions of the surface of the charge carrying layer comprises scanning the laser beam in the form of a strip from an end of the substrate to the other end of the substrate, and then moving the substrate or the optical system and polygon mirror in a direction perpendicular to the direction of the strip.

12. The method of claim 11, wherein the substrate is moved in a direction perpendicular to the direction of the strip using a stage.

13. An organic light emitting display apparatus manufactured using the method according claim 11.

14. The method of claim 1, wherein the forming of the organic emissive layers is performed using a nozzle printing method.

15. An organic light emitting display apparatus manufactured using the method according claim 1.

* * * * *